United States Patent
Shappir

(10) Patent No.: US 11,972,823 B2
(45) Date of Patent: Apr. 30, 2024

(54) MITIGATION OF TRANSISTOR RELIABILITY DEGRADATION WITHIN MEMORY CIRCUITS

(71) Applicant: Apple Inc., Cupertino, CA (US)

(72) Inventor: Assaf Shappir, Ganey Tikva (IL)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 17/942,143

(22) Filed: Sep. 11, 2022

(65) Prior Publication Data

US 2024/0087666 A1  Mar. 14, 2024

(51) Int. Cl.
G11C 29/00 (2006.01)
G06F 11/10 (2006.01)
G11C 29/42 (2006.01)

(52) U.S. Cl.
CPC .......... *G11C 29/42* (2013.01); *G06F 11/1048* (2013.01)

(58) Field of Classification Search
CPC ............................ G11C 29/42; G06F 11/1048
See application file for complete search history.

(56) References Cited

U.S. PATENT DOCUMENTS

| | | | | |
|---|---|---|---|---|
| 9,075,741 B2 * | 7/2015 | Koker | ................ | G06F 11/1008 |
| 9,786,356 B2 | 10/2017 | Wang et al. | | |
| 9,817,601 B1 | 11/2017 | Zhang et al. | | |
| 10,122,347 B2 | 11/2018 | Cho et al. | | |
| 2004/0136236 A1 * | 7/2004 | Cohen | ................ | G11C 16/3459 |
| | | | | 365/185.2 |
| 2009/0122610 A1 * | 5/2009 | Danon | ................ | G11C 11/5628 |
| | | | | 365/185.08 |
| 2015/0055414 A1 * | 2/2015 | Chen | ....................... | G11C 5/063 |
| | | | | 438/618 |
| 2021/0208965 A1 * | 7/2021 | Cha | ........................ | G11C 11/406 |
| 2021/0398604 A1 * | 12/2021 | Li | ........................ | G11C 16/3445 |
| 2022/0164254 A1 * | 5/2022 | Smittle | ................ | G06F 11/1405 |

(Continued)

OTHER PUBLICATIONS

Wikipedia, "ECC Memory," pp. 1-9, Jul. 2, 2022, as downloaded from https://web.archive.org/web/20220807183924/https://en.wikipedia.org/wiki/ECC_memory.

(Continued)

*Primary Examiner* — Samir W Rizk
(74) *Attorney, Agent, or Firm* — KLIGLER & ASSOCIATES PATENT ATTORNEYS LTD.

(57) ABSTRACT

A controller includes an interface and circuitry. The interface communicates with memory cells arranged in multiple address locations. Storage nodes holding storage values included in the memory cells are accessible using select transistors powered by an adjustable supply voltage. The circuitry reads data units protected by an Error Correction Code (ECC) from the memory cells and decode the ECC of the data units. Upon detecting, using the ECC, that a given data unit read from a given address location contains one or more errors, the circuitry logs an error event specifying at least a time of occurrence associated with the error event and the given address location. The circuitry identifies that the select transistors experience physical degradation due to aging, based on the times of occurrence and address locations logged in the error events, and adjusts the supply voltage provided to the select transistors to compensate for the physical degradation.

21 Claims, 4 Drawing Sheets

(56) References Cited

U.S. PATENT DOCUMENTS

2022/0406349 A1* 12/2022 Morozumi ........... G11C 7/1039

OTHER PUBLICATIONS

Infineon Technologies AG, "Synchronous SRAM with On-Chip EC", pp. 1-2, year 2014, as downloaded from https://www.infineon.com/dgdl/Infineon-Synchronous_SRAM_with_ECC_Product_Overview-ProductBrief-v01_00-EN.pdf?fileId=8ac78c8c7d0d8da4017d0f65c9f35315.

Liu, "Imec Demonstrates Capacitor-less IGZO-Based DRAM Cell With >400 Retention Time," Press Release, pp. 1-8, Dec. 15, 2020, as downloaded from https://www.imec-int.com/en/press/imec-demonstrates-capacitor-less-igzo-based-dram-cell-400s-retention-time.

Jones, "IC Knowldge LLC," SemiWiki—The Open Forum For Semiconductor Professionals, pp. 1-4, Jan. 27, 2022, as downloaded from https://semiwiki.com/semiconductor-services/ic-knowledge/307013-samsung-keynote-at-iedm/.

EEC-SRAM—Error Correcting Code for SRAMs, CAST, pp. 1-3, year 2022, as downloaded from https://www.cast-inc.com/peripherals/memory-controllers/ecc-sram.

Bacha et al., "Dynamic Reduction of Voltage Margins by Leveraging On-chip ECC in Itanium II Processors", Proceedings of the 40th Annual International Symposium on Computer Architecture, pp. 1-11, year 2013.

Bacha et al., "Using ECC Feedback to Guide Voltage Speculation in Low-Voltage Processors", 47th Annual IEEE/ACM International Symposium on Microarchitecture, pp. 1-13, year 2014.

Leblebici et al., "Hot-carrier reliability of MOS VLSI circuits", Kluwer Academic Publishers, chapter 1.6, pp. 1-9, year 1993 as downloaded from https://books.google.nl/books?hl=en&lr=&id=TNfcBwAAQBAJ&oi=fnd&pg=PR12&dq=+Hot-carrier+Reliability+of+MOS+VLSI +Circuits&ots=XCWgYbq2IM&sig=rBCyzRpVkBlqTofA8Bq8BQU1bHY&redir_esc=y#v=onepage&q&f=false.

* cited by examiner

MITIGATION OF TRANSISTOR RELIABILITY DEGRADATION WITHIN MEMORY CIRCUITS

TECHNICAL FIELD

Embodiments described herein relate generally to data storage, and particularly to methods and systems for mitigating reliability degradation of transistors in memory circuits.

BACKGROUND

The supply voltage provided to memory devices in storage systems is typically configured with a voltage guard band, to account for reliability degradation of memory cells over time and other factors causing readout errors.

Mechanisms for physical degradation of MOS VLSI circuits and usage of guard bands are described, for example, in a book by Y. Leblebici, S. M. Kang, entitled "Hot-carrier reliability of MOS VLSI circuits," Kluwer Academic Publishers (1993). For example, in accordance with an overview section of this book (section 1.6, page 10), the book addresses the issues related to hot-carrier reliability of MOS VLSI circuits from the device physics as well as from the circuit design perspective, by presenting a unified view if the physical mechanisms involved in hot-carrier induced device degradation, the prevalent models for these degradation mechanisms, and the simulation methods for estimating hot-carrier effect in the circuit environment.

SUMMARY

An embodiment that is described herein provides a controller that includes an interface and circuitry. The interface serves for communicating with a plurality of memory cells arranged in multiple address locations. Storage nodes holding storage values included in the memory cells are accessible using respective select transistors being powered by an adjustable supply voltage. The circuitry is configured to read data units protected by an Error Correction Code (ECC) from the memory cells, and decode the ECC of the data units, and upon detecting, using the ECC, that a given data unit read from a given address location contains one or more errors, to log an error event specifying at least a time of occurrence associated with the error event and the given address location. The circuitry is further configured to identify that the select transistors experience physical degradation due to aging, based on the times of occurrence and address locations logged in the error events, and to adjust the supply voltage provided to the select transistors to compensate for the physical degradation.

In some embodiments, the circuitry is configured to identify that the select transistors experience physical degradation by determining that at least some of the error events meet a localization criterion among the address locations. In other embodiments, the circuitry is configured to identify localized error events sharing a common address location, and to determine that the error events meet the localization criterion in response to detecting that a rate of the localized error events exceeds a localized error rate threshold. In yet other embodiments, the circuitry is configured to include in the error event a correctability indication of whether the errors in the data unit are correctable or not using the ECC, and to identify that the select transistors experience physical degradation when a rate of the error events corresponding to uncorrectable data units exceeds a specified uncorrectable rate.

In an embodiment, the circuitry is configured to refrain from adjusting the supply voltage for compensating for the physical degradation of the select transistors, in response to detecting that an operational parameter of a memory device including the memory cells does not meet a specified condition. In another embodiment, the circuitry is configured to apply one or more memory management countermeasures for reducing a rate of the error events, and to adjust the supply voltage provided to the select transistors in response to identifying that the rate of the error events has not reduced by applying the countermeasures. In yet another embodiment, the circuitry is configured to read the data units from the memory cells using non-destructive read operations, and to re-read an uncorrectable data unit after adjusting the supply voltage provided to the select transistors.

In some embodiments, the circuitry is configured to increase the supply voltage provided to the select transistors gradually during a lifetime of the memory cells. In other embodiments, the select transistors are constructed from non-silicon materials. In yet other embodiments, the circuitry is configured to measure one or more environmental parameters selected from a list including: a geographical altitude and a geographical location, and to determine whether the select transistors experience the physical degradation based on one or more of the environmental parameters.

There is additionally provided, in accordance with an embodiment that is described herein, a method for data storage, including, in a controller that communicates with a plurality of memory cells arranged in multiple address locations, and storage nodes holding storage values included in the memory cells are accessible using respective select transistors being powered by an adjustable supply voltage, reading data units protected by an Error Correction Code (ECC) from the memory cells, and decoding the ECC of the data units. Upon detecting, using the ECC, that a given data unit read from a given address location contains one or more errors, an error event specifying at least a time of occurrence associated with the error event and the given address location is logged. An identification that the select transistors experience physical degradation due to aging is made, based on the times of occurrence and address locations logged in the error events, and the supply voltage provided to the select transistors is adjusted to compensate for the physical degradation.

There is additionally provided, in accordance with an embodiment that is described herein, a controller that includes an interface and control circuitry. The interface serves for communicating with a memory comprising a plurality of memory cells arranged in multiple address locations, the memory is powered by an adjustable supply voltage. The control circuitry is configured to read data units protected by an Error Correction Code (ECC) from the memory cells, and decode the ECC of the data units, and upon detecting, using the ECC, that a given data unit read from a given address location contains one or more errors, to log an error event specifying at least a time of occurrence associated with the error event and the given address location. The control circuitry is further configured to identify that the memory experiences physical degradation due to aging, based on the times of occurrence and address locations logged in the error events, and to adjust the supply voltage provided to the memory to compensate for the physical degradation.

These and other embodiments will be more fully understood from the following detailed description of the embodiments thereof, taken together with the drawings in which:

DETAILED DESCRIPTION OF EMBODIMENTS

Overview

Figure 1:
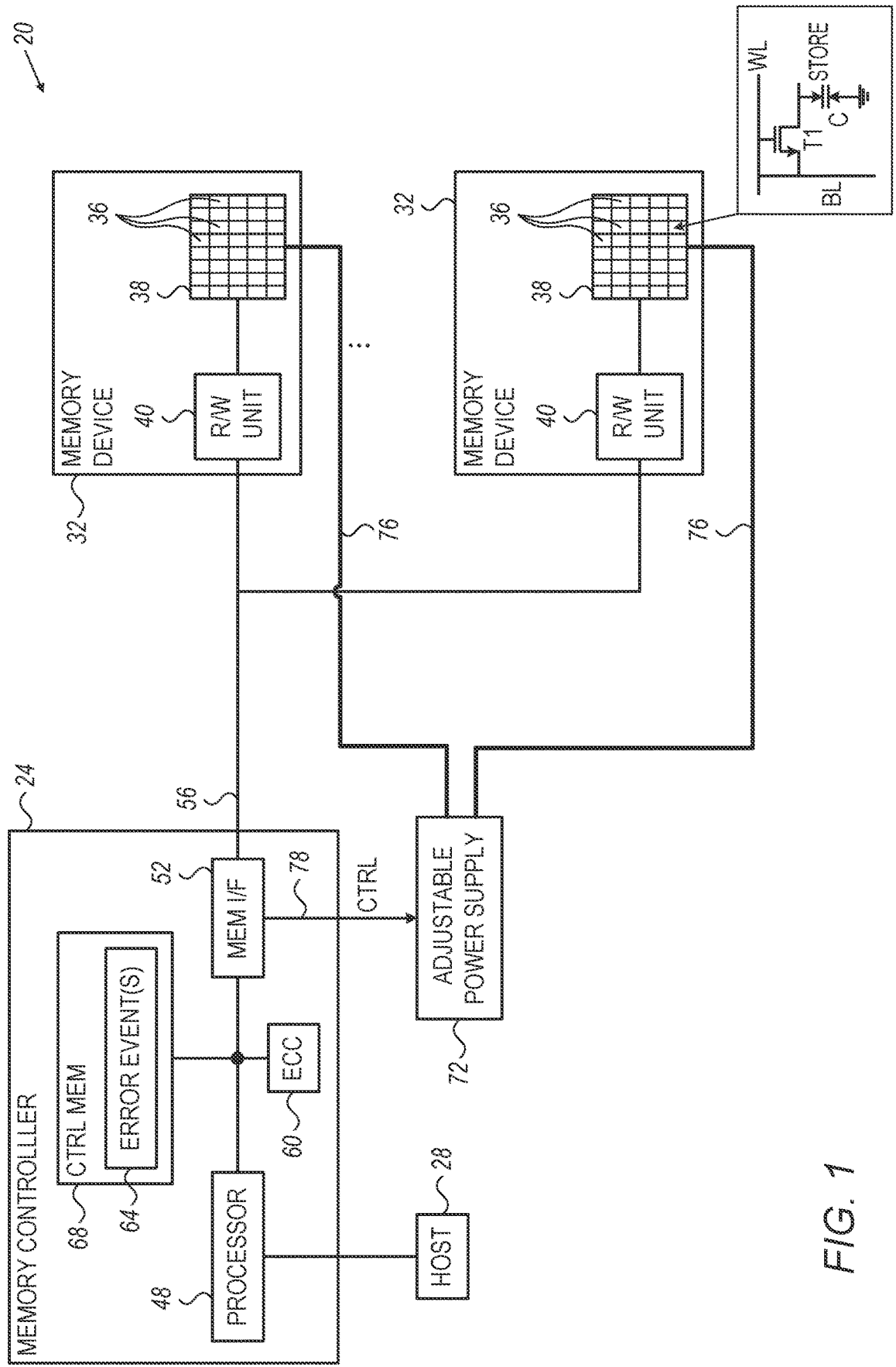
FIG. 1 is a block diagram that schematically illustrates a memory system mitigating reliability degradation of select transistors with age, in accordance with an embodiment that is described herein.

Embodiments that are described herein provide methods and systems for mitigating memory reliability degradation related to physical degradation of the select transistors accessing memory cells due to aging.

Various types of memory cells built from Complementary Metal-Oxide-Semiconductor (CMOS) transistors include select transistors that may degrade physically with time and usage. A memory cell of this sort typically comprises a storage element holding a storage value, and one or more select transistors that when provided a suitable voltage at the gate, enable sensing the storage value. The storage element of a memory cell is also referred to as a "storage node," and the select transistor is also referred to as an "access device." Depending on the type of the memory cell in question, different types of storage elements are typically used. For example, in Dynamic Random Access Memory (DRAM) and Ferroelectric memory cells, the storage element comprises a capacitor. As another example, in Resistive RAM (RRAM), Magnetoresistive RAM (MRAM) and Phase Change Memory (PCM), the storage element comprises a resistive element.

In the context of the present patent application and in the claims, the phrase "select transistors accessing memory cells" means that the select transistors are used for accessing the storage nodes of the memory cells.

The reliability of the select transistor may degrade over time due to various physical mechanisms such as Bias Temperature Instability (BTI) and Hot Carrier Injection (HCI), which result in increasing the threshold voltage and decreasing the drain current of the select transistor. Increased threshold voltage may cause a readout error e.g., due to leakage of the storage element. Physical degradation of the select transistors with usage typically worsens with high electric fields and temperatures.

Unlike transient readout errors, which occur randomly at different address locations, readout errors caused due to physical degradation of the select transistors with age tend to be localized and persistent. Moreover, the approach of refreshing storage values in the storage elements of the memory cells to rewrite the correct storage values, is inapplicable for mitigating physical degradation in the select transistors due to aging.

To ensure reliable readout operation throughout the entire lifetime of the device (e.g., on the order of 5 years or more), the supply voltage provided to the gates of the select transistors may be configured to include a voltage margin referred to as a "voltage guard band," or simply "guard band" for brevity. The guard band may be set to account for various factors such as fluctuations in the supply voltage, ground noise, clock inaccuracies, design weaknesses, component specification violations and the like. A guard-band added to account for physical degradation of the select transistors due to aging is sometimes referred to as a "reliability guard band."

In general, a small-valued guard band is advantageous, because a large guard band increases power consumption, and causes high electric fields and temperatures, which in turn accelerate the degradation process.

Physical degradation of select transistors due to aging is a major concern, e.g., in memory devices having a three-dimensional (3D), when using materials other than single crystal silicon in the select transistors of the memory cells, and when targeting a large number (e.g., between $10^{12}$ and $10^{15}$ or more) of read/write cycles during lifetime.

In principle, the guard band may be set to a constant value throughout the device's lifetime, wherein the value of the guard band is selected to account for worst case conditions such as highest expected temperatures and worst process corners. A typical user, however, may operate well below worst case conditions and could advantageously use a much smaller guard band without compromising reliability.

Some storage systems mitigate low-rate errors caused by operational and physical phenomena, by employing some form of error correction capabilities. For example, with memory devices storing one bit per cell, e.g., Random Access Memory (RAM) devices such as a Static RAM (SRAM) and a Dynamic RAM (DRAM), phenomena such as bit flip errors caused by cosmic radiation, row hammer security attacks, variable retention time, Stress-Induced Leakage Current (SILC), erratic errors (occurring randomly due to a write failure) and oxide breakdown, can be mitigated with an Error Correction Coded (ECC) that corrects one bit. Such an ECC may also detect up to two bits in a data unit but in contrast to some disclosed embodiments, this information is conventionally unused. Future storage technologies may also support the correction of more than a single bit. As another example, with memory devices that store multiple bits per cell, such as NAND devices, an ECC correcting more than two errors is typically used, e.g., correcting hundreds of erroneous bits in a 16 Kbytes page.

In addition to ECC, a storage system may also support various memory management methods for mitigating readout errors, such as adjusting read thresholds, refreshing the stored data, wear leveling and the like. ECC and memory management methods without setting a voltage guard band may, however, be insufficient in mitigating readout errors as the select transistors in the memory cells or memory array age.

In the disclosed embodiments, error events are logged and analyzed to identify physical degradation of the select transistors accessing memory cells, due to aging. The supply voltage provided to the gate of the select transistors is initially configured to a minimal safe value, and increased gradually during lifetime, to compensate for the physical degradation of the select transistors due to aging.

Consider a controller comprising an interface and circuitry. The interface is used for communicating with a plurality of memory cells arranged in multiple address locations, wherein storage nodes holding storage values comprised in the memory cells are accessible using respective select transistors being powered by an adjustable supply voltage. The circuitry is configured to read data units protected by an Error Correction Code (ECC) from the memory cells, and to decode the ECC of the data units. Upon detecting, using the ECC, that a given data unit read from a given address location contains one or more errors, the circuitry logs an error event specifying at least a time of occurrence associated with the error event and the given address location. When identifying that the select transistors experience physical degradation due to aging, based on the times of occurrence and address locations logged in the error events, the circuitry adjusts the supply voltage provided to the select transistors to compensate for the physical degradation.

In some embodiments, the circuitry identifies that the select transistors experience physical degradation by determining that at least some of the error events meet a localization criterion among the address locations. For example, the localization criterion is met when a rate of localized error events sharing a common address location exceeds a localized error rate threshold.

The circuitry may include in the error event a correctability indication of whether the errors in the data unit are correctable or not using the ECC, and to identify that the select transistors experience physical degradation when a rate of the error events corresponding to uncorrectable data units exceeds a specified uncorrectable rate.

The memory device in which the memory cells reside is typically designed to operation while meeting one or more specified conditions. To avoid false identification of degraded select transistors due to aging, the circuitry refrains from adjusting the supply voltage for compensating for the physical degradation of the select transistors, in response to detecting that an operational parameter of a memory device comprising the memory cells does not meet a specified condition. The conditions may specify, for example, a temperature range, a supply voltage range or any other suitable operational condition.

In some embodiments the memory controller supports memory management countermeasures for mitigating readout errors. In such embodiments, the circuitry may apply one or more of the memory management countermeasures for reducing a rate of the error events and adjust the supply voltage provided to the select transistors when the rate of the error events has not reduced by applying the countermeasures.

In some embodiments, the memory devices support non-destructive read operations, in which case the circuitry may re-read uncorrectable data units after adjusting the supply voltage provided to the select transistors.

By identifying physical degradation of the select transistors, the circuitry may apply an adaptive scheme that increases the supply voltage gradually during a lifetime of the memory cells, e.g., in one or more voltage steps.

The disclosed embodiments are applicable, for example, to memory systems employing emerging new technologies in which the select transistors are constructed from non-silicon materials.

In an embodiment, in addition to the error events, the circuitry uses other information for identifying physical degradation of the select transistors. For example, the circuitry measures one or more environmental parameters including a geographical altitude and a geographical location, and determines whether the select transistors experience the physical degradation based on one or more of the environmental parameters.

In the disclosed techniques, error events occurring while reading data from memory are logged. By distinguishing, based on the error events, between transient errors and long-term errors, the memory controller can identify physical degradation of the select transistors used for accessing storage nodes in memory cells, and compensate for this degradation by increasing the supply voltage provided to the gates of the select transistors. The disclosed embodiments can be used for gradually increasing the supply voltage, e.g., in one or more voltage steps, thus retaining high readout reliability at low supply voltages throughout lifetime.

System Description

FIG. 1 is a block diagram 20 that schematically illustrates a memory system mitigating reliability degradation of select transistors with age, in accordance with an embodiment that is described herein.

Memory system 20 comprises a memory controller 24 that stores data, e.g., for a host 28, in memory devices 32. Although in FIG. 1, the memory system comprises multiple memory devices (two in the present example), in alternative embodiments, the memory system may comprise a single memory device or more than two memory devices.

Memory system 20 can be used in various host systems and devices, such as in computing devices, cellular phones or other communication terminals, removable memory modules, Solid State Disks (SSD), Secure Digital (SD) cards, Multi-Media Cards (MMC) and embedded MMC (eMMC), digital cameras, music and other media players and/or any other system or device in which data is stored and retrieved.

Memory device 32 comprises multiple memory cells 36 arranged in a memory array 38. Memory array 38 may comprise any suitable type of volatile or non-volatile memory having select transistors in the memory cells, such as, for example, a Random Access Memory (RAM) such as, for example, a SRAM, a DRAM, a Magnetoresistive RAM (MRAM) or a Resistive RAM (RRAM), a Phase change Memory (PCM), a Ferroelectric RAM (FeRAM), and a Ferroelectric Field-Effect Transistor (Fe FET) memory. Alternatively, in other embodiments, the memory array comprises NAND memory cells, in which case two select transistors are used for selecting a column of transistors serving as storage nodes. Further alternatively, the memory array may comprise a Read Only Memory (ROM), an array of fuses, and/or an array of latches.

The inset at the bottom right corner of FIG. 1 depicts an example memory cell 36 comprising a DRAM cell. In the present example, the memory cell comprises a select transistor denoted 'T1' and a storage node comprising a capacitor denoted 'C'. A memory cell comprising a single transistor and a capacitor is sometimes referred to as a T1-C cell. A Word Line (denoted WL) is coupled to the gate of the select transistor and a Bit Line (denoted BL) is coupled to the drain of the select transistor. In some embodiments, to access the storage node of the memory cell, the W/R unit sets its gate voltage to be higher than its threshold voltage. Although in FIG. 1 the memory cells comprise DRAM cells, in alternative any other suitable types of memory cells, e.g., as mentioned above, may also be used.

Memory device 32 further comprises a Read/Write (R/W) unit 40, which writes data values into memory cells 36 and reads data values from the memory cells. Depending on the type of memory array 38, a memory cell 36 stores a suitable data value (e.g., storage value) represented by one or more bits. For example, RAM devices such as SRAM and DRAM devices typically store a single bit per cell, whereas a NAND device typically stores multiple bits per cell.

In some embodiments, the memory cells are accessible for read and write by providing to the R/W unit a specified address location in the memory array, wherein the address location may contain one or more groups of memory cells that are accessed together. A group of memory cells 36 programmed to or retrieved from the memory device in a write or read operation is referred to herein as a "data unit." For example, in NAND devices, an address location typically corresponds to a WL of memory cells storing multiple data units (e.g., multiple data pages per WL).

In some embodiments, memory device 32 supports non-destructive read operations that do not erase the data being read in the process of reading it. For example, SRAM, FLASH, RRAM, PCM and MRAM devices support non-destructive read operations, but after applying many read operations the stored bit values may be erroneously flip. In other embodiments, memory device 32 supports destructive read operations. In such embodiments the read operation inherently erases the data that was read, requiring it to be immediately written back to the memory cells to prevent loss of data. For example, T1-C DRAM and T1-C FeRAM devices support destructive read operations.

Memory controller 24 comprises a processor 48, which communicates with memory devices 32 via a memory interface 52, using any suitable bus or link 56. Among other tasks, processor 48 controls an Error Correction Code (ECC) module 60, for encoding the data for storage with a certain ECC and decoding the ECC of data retrieved from the memory cells. In some embodiments, in response to identifying, using the ECC, that a data unit retrieved contains one or more errors, processor 48 logs a corresponding error event 64 in a controller memory 68. Alternatively, the processor may log the error event in any other suitable memory accessible to the memory controller.

Memory system 20 comprises an adjustable power supply module 72 that provides supply voltage(s) to memory devices 32, via power rails 76. In the present example the power supply may provide different supply voltage levels to respective memory devices 32. For a given memory device, the power supply module typically provides different voltage levels to R/W unit 40, storage nodes of the memory array and gates of select transistors of the memory cells (or of columns in the memory array such as in NAND devices). Specifically, in some embodiments the supply voltage provided to the gates of the select transistors is adjustable.

In some embodiments, processor 48 determines the supply voltage for the select transistors in a given memory device 32 based on error events 64 and produces control signals 78 to the power supply (e.g., via memory interface 52 or via any other suitable interface) to output the required voltage level. For example, the processor may control the power supply to produce a nominal low supply voltage for the select transistors at start of life, and control the power supply to adjust the supply voltage when identifying, based on the error events, that reliability of the select transistors has degraded due to physical degradation with age.

In the example embodiment of FIG. 1, ECC module 60 resides in memory controller 24. This configuration, however, is not mandatory, and in alternative embodiments, the memory devices comprise internal ECC modules. A memory device configured with an internal ECC is supported by some vendors of SRAM and DRAM devises, for example.

Memory controller 24 may be implemented in hardware, e.g., using one or more Application-Specific Integrated Circuits (ASICs) or Field-Programmable Gate Arrays (FPGAs). Alternatively, the memory controller may comprise a microprocessor (e.g., processor 48) that runs suitable software, or a combination of hardware and software elements. Memory device 68 of the memory controller may comprise any suitable type of a storage device, e.g., a RAM.

The memory system configuration of FIG. 1 is an example memory system configuration, which is shown purely for the sake of conceptual clarity. Any other suitable memory system configuration can also be used. For example, although the example of FIG. 1 shows two memory devices, in alternative embodiments memory controller 24 may control a single memory device, or more than two memory devices 32. Elements that are not necessary for understanding the principles of the present disclosure, such as various interfaces, addressing circuits, timing and sequencing circuits and debugging circuits, have been omitted from the figure for clarity.

In the example memory system configuration shown in FIG. 1, memory devices 32 and memory controller 24 are implemented as separate Integrated Circuits (ICs). In alternative embodiments, however, the memory devices and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory arrays are disposed. Further alternatively, some or all of the functionality of memory controller 24 can be implemented in software and carried out by a processor or other element of the host system. In some embodiments, host 28 and memory controller 24 may be fabricated on the same die, or on separate dies in the same device package.

In some embodiments, memory controller 24 comprises a processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

The example of FIG. 1 depicts a particular example embodiment of a memory system, in which a "control circuitry" comprises processor 48, ECC 60 and controller memory 68. (The control circuitry may also perform writing and reading operations). Alternatively, other suitable configurations of a control circuitry can also be used.

Methods for Mitigating Readout Errors Caused by Physical Degradation of Select Transistors Readout errors caused by transient phenomena typically occur randomly in different address locations of the memory device. In contrast, readout errors caused by physical degradation of the select transistors in memory cells (or memory arrays) with age are typically localized, e.g., occur in one or more data units of the same address location. Moreover, as the select transistors physically degrade with age, the error rate increases, resulting in uncorrectable errors.

Figure 2:
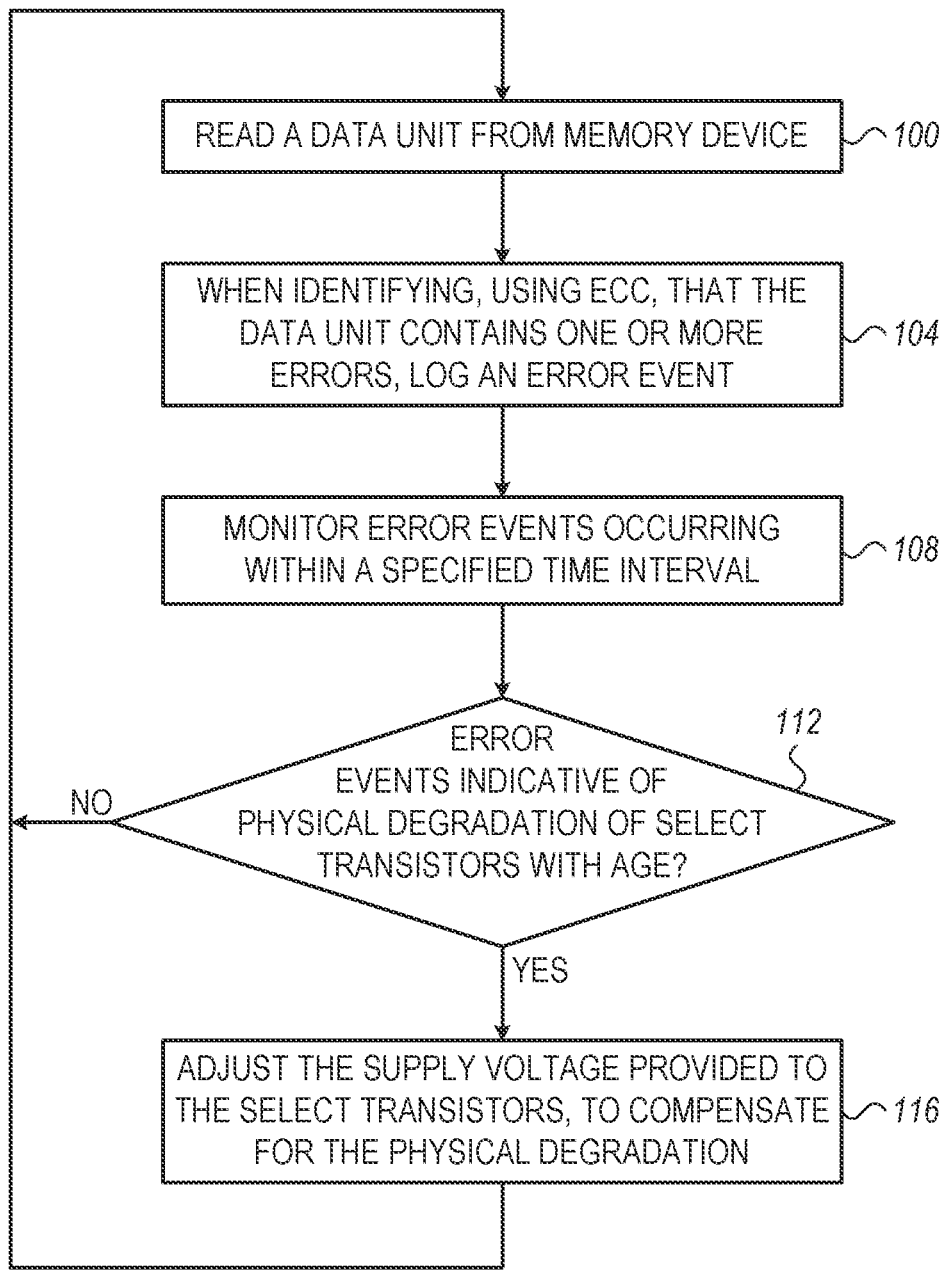
FIG. 2 is a flow chart that schematically illustrates a method for mitigating readout errors caused by physical degradation of select transistors due to aging, in accordance with an embodiment that is described herein.

FIG. 2 is a flow chart that schematically illustrates a method for mitigating readout errors caused by physical degradation of select transistors due to aging, in accordance with an embodiment that is described herein.

The method will be described as executed by processor 48 of memory controller 24 of FIG. 1.

The method begins at a reading step 100, with processor 48 reading a data unit from memory cells 36 comprised in a given address location (e.g., specifying a corresponding WL) of a memory device 32. The read data unit is encoded with a suitable ECC (e.g., using ECC module 60).

At an error checking step 104, the processor decodes the ECC of the data unit to detect whether the data unit is erroneous or not. When the processor identifies, using the ECC module, that the data unit contains one or more errors, the processor logs a corresponding error event 64 in controller memory 68. Alternatively, the processor may log error events 64 in any suitable memory other than memory 68, internal or external to the memory controller.

The processor may log any suitable information in the error events. In an example embodiment, the processor logs in the error event, the address location from which the erroneous data unit was read, the number of errors detected in the data unit, and a timestamp specifying a time of occurrence associated with the error event. In the present context and in the claims, the term "time of occurrence" refers to a time range related to the error event, e.g., any time instance between the time of initiating the read operation and the time of completion of logging the error event. It is noted that in many real-life applications, a single bit ECC is included to mitigate errors caused by cosmic radiation, which errors are typically highly sporadic in time and location. The time of occurrence is therefore important is distinguishing between such errors and errors caused by physical degradation of select transistors.

At an error monitoring step 108, processor 48 monitors error events that were logged within a specified time interval. At a query step 112, the processor checks whether at least some of the error events in the time interval are indicative of physical degradation of the select transistors with age, and if not, loops back to step 100 to read a subsequent data unit from the same or different address location.

When at step 112 the processor identifies that the error events are indicative of physical degradation of the select transistors due to aging, the processor proceeds to a supply voltage adjustment step 116, at which the processor determines an updated supply voltage level for the gates of the select transistors, and controls power supply 72 to provide the updated supply voltage level to the select transistors. For example, the processor controls the power supply to increase the supply voltage provided to the select transistors, to compensate for the physical degradation of the select transistors with age. Following step 116 the processor loops back to step 100 to read a subsequent data unit as described above.

In some embodiments, after increasing the supply voltage level, the processor checks whether the error rate has reduced (e.g., based on error events), and if so, retains the increased supply voltage level to the select transistors until meeting the condition at step 112 recurs. In these embodiments, the processor manages an adaptive scheme that increases the supply voltage provided to the gates of the select transistors by a voltage step each time (or selectively part of the times) the condition at step 112 is met.

Figure 3:
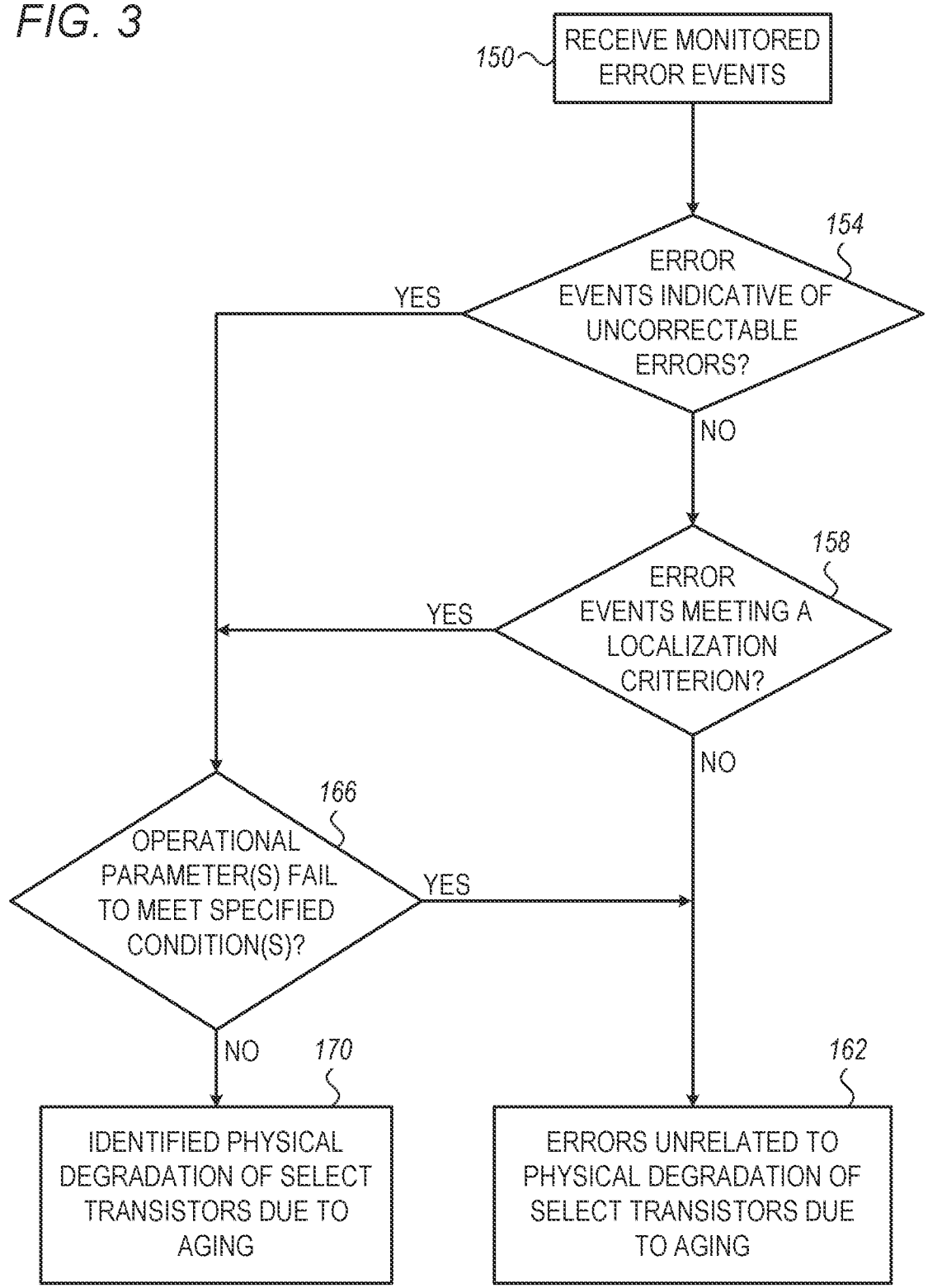
FIG. 3 is a flow chart that schematically illustrates a method for identifying whether select transistors experience physical degradation due to aging, in accordance with an embodiment that is described herein.

FIG. 3 is a flow chart that schematically illustrates a method for identifying whether select transistors experience physical degradation due to aging, in accordance with an embodiment that is described herein.

The method of FIG. 3 may be used, for example, in implementing step 112 of the method of FIG. 2. Other methods for this purpose will be described further below.

The method of FIG. 3 begins with processor 48 receiving monitored error events, at an error monitoring step 150. At correctability query step 154, the processor checks whether the error events are indicative of uncorrectable errors, e.g., by evaluating the rate of error events corresponding to read data units that could not be corrected using the ECC. In an embodiment, the processor decides that the error events are indicative of uncorrectable errors when the rate of uncorrectable error events exceeds a specified uncorrectable rate threshold.

When at step 154 the error events are not identified as uncorrectable, the processor proceeds to check a localization criterion, at a localization query step 158. For example, the processor identifies localized error events sharing a common address location, e.g., errors occurring in one or more data units of the same WL. The processor decides that the localization criterion is met when the rate of the localized error events exceeds a localized error rate threshold.

When at step 158 the localization criterion is not met, the processor proceeds to a no degradation reporting step 162 to output an indication that the error events are unrelated to physical degradation of the select transistors with age, and the method terminates.

When the condition at step 154 or 158 is met (the error events are identified as uncorrectable or localized), the processor proceeds to a query step 166 to check whether one or more operational parameters (e.g., temperature and supply voltage) meet respective specified conditions. Failing to meet the specified conditions means that the processor cannot determine reliably that the cause of the errors is physical degradation of the select transistors. In general, the processor may check any parameter related to a circuit or system indicator and/or a sensor to verify that the memory device meets the specified conditions, before deciding to increase the supply voltage. Examples parameters include device temperature, supply voltage, low battery, high amplitude, high vibration, high system electrical current draw, electronic interference, ground bounce, Input/Output (I/O) noise level, and the like.

In the present context the term "device temperature" refers to the package temperature, surface temperature and/or junction temperature.

In an example embodiment, at step 166 the processor checks the condition by checking whether the device temperature falls within a specified range of temperatures. Alternatively or additionally, at step 166, the processor checks whether the supply voltage falls within a specified voltage range.

When one or more of the conditions at step 166 is not met, the processor proceeds to step 162 described above. Otherwise, the operational conditions are met, and the processor outputs an indication that the error events are indicative of physical degradation of the select transistors due to aging, at a degradation reporting step 170, and the method terminates.

Incorporation of Memory Management Countermeasures

In some embodiments, memory system 20 supports various memory management countermeasures for mitigating readout errors, in addition to ECC. Such embodiments allow an operational margin for reducing the error rate by applying one or more memory management countermeasures, before increasing the supply voltage provided to the select transistors. Supported countermeasures may include, for example, wear leveling methods, increasing the rate of data refresh (e.g., in DRAM), adjusting read thresholds (in Flash memory), increasing the rate of data scrubbing (re-write a retrieved data unit after ECC correction), applying data flipping to prevent imprint, and the like.

Consider an embodiment of memory system 20 in which ECC module 60 can correct a single bit or multiple bits. Processor 48 reads data from the memory device and monitors the error rate based on logged error events. While the error rate remains low (e.g., below an error rate threshold), such as in case of transient errors caused, e.g., by cosmic radiation, sporadic bit flips, and the like, the ECC is capable of correcting erroneous data units, and no additional mitigation measures are required.

When the processor identifies that the error rate exceeds the error rate threshold, but (i) the erroneous data units are still correctable (e.g., based on identifying that multiple read units require ECC scrubbing within a specified short time interval) or (ii) the error events are indicative of uncorrectable but localized errors, the processor attempts reducing the error rate by initiating one or more of the memory management countermeasures supported. In an embodiment, when the error events are indicative of stuck bits, the processor marks corresponding address locations as "bad addresses" or initiating a column or row replacement operation, e.g., in addition to applying the countermeasures. If the error events are indicative of unlocalized errors, and/or the error rate does not reduce by applying the counter measures, the processor increases the supply voltage to compensate for physical degradation of the select transistors due to aging.

When identifying that the error rate exceeds the error rate threshold and that the error events are indicative of uncorrectable errors, the processor applies error mitigation depending on the type of read operations, as described herein. when the memory device employs non-destructive read operations (such as, for example, in 2T DRAM, MRAM and RRAM) the processor increases the supply voltage and re-reads the failing data units. In case the memory device employs destructive read operations, the processor initiates one or more of the counter measures supported, and continues to monitor error events. When the rate of uncorrectable error events does not reduce while applying the countermeasures, the processor increases the supply voltage, in an embodiment.

It is noted that in destructive read operations, when the errors are still correctable, the processor may apply re-reading similarly to the non-destructive case described above. In such embodiments, the processor corrects errors of an erroneous data unit retrieved, using the ECC, and writes the corrected data unit back (e.g., a scrubbing operation). The processor re-reads this data unit and if the error reoccurs attempts mitigating such errors by increasing the voltage level supplied to the select transistors.

Next is described an example embodiment in which processor 48 does not support memory management countermeasures for mitigating errors. It is also assumed that the processor sets the supply voltage of the select transistors (e.g., at start of life) to a default value.

Assume a fatal memory error (e.g., reading one or more erroneous data units in which the errors are uncorrectable using the ECC), forcing the memory system to reboot. If after reboot the processor detects another fatal error within a predefined period (e.g., within 10 minutes), the processor sets the supply voltage provided to the select transistors to an updated value higher than the default value. If after increasing the supply voltage to the select transistors the memory system stabilizes (e.g., no fatal failure occurs within the next hour), the processor sets the updated value as the new default value. Otherwise, fatal errors recur, meaning that increasing the supply voltage to the select transistors did not resolve the problem, and the processor reduces the supply voltage to the previous value and sets back the previous default value.

In some embodiments, ECC module 60 of memory system 20 is capable of correcting more than a single bit. In such embodiments, the processor accurately characterizes the errors origin, and accordingly initiates the most suitable countermeasure among the countermeasures supported. Moreover, applying memory management countermeasures without increasing (or gradually increasing during lifetime) the supply voltage to the select transistors is advantageous, because higher supply voltages involve higher electric fields and temperatures, which in turn accelerate aging effects.

In some embodiments, in addition to determining the supply voltage to be provided to the select transistors based on the logged error events, the memory controller determines the supply voltage to be provided to the select transistors based on other information such as, for example, geographical altitude and/or geographical location. For example, at high altitudes cosmic radiation increases, which increases the rate of transient errors but does not degrade the select transistors in the memory cells. As another example, some geographical locations cause high-level interferences and/or include many sources of errors, such as, for example, X-ray machines in airports. In such cases the processor refrains from deciding that the select transistors have degraded physically due to aging.

In some embodiments, processor 48 of the memory controller (or some other processor) analyzes the logged error events and corresponding actions taken over long periods of time, using Artificial Intelligence (AI) techniques. Using AI allows better identification of scenarios in which increasing the supply voltage to the select transistors of memory cells (or columns of memory cells) may be effective in mitigating readout errors due to physical degradation of the select transistors with age.

Figure 4:
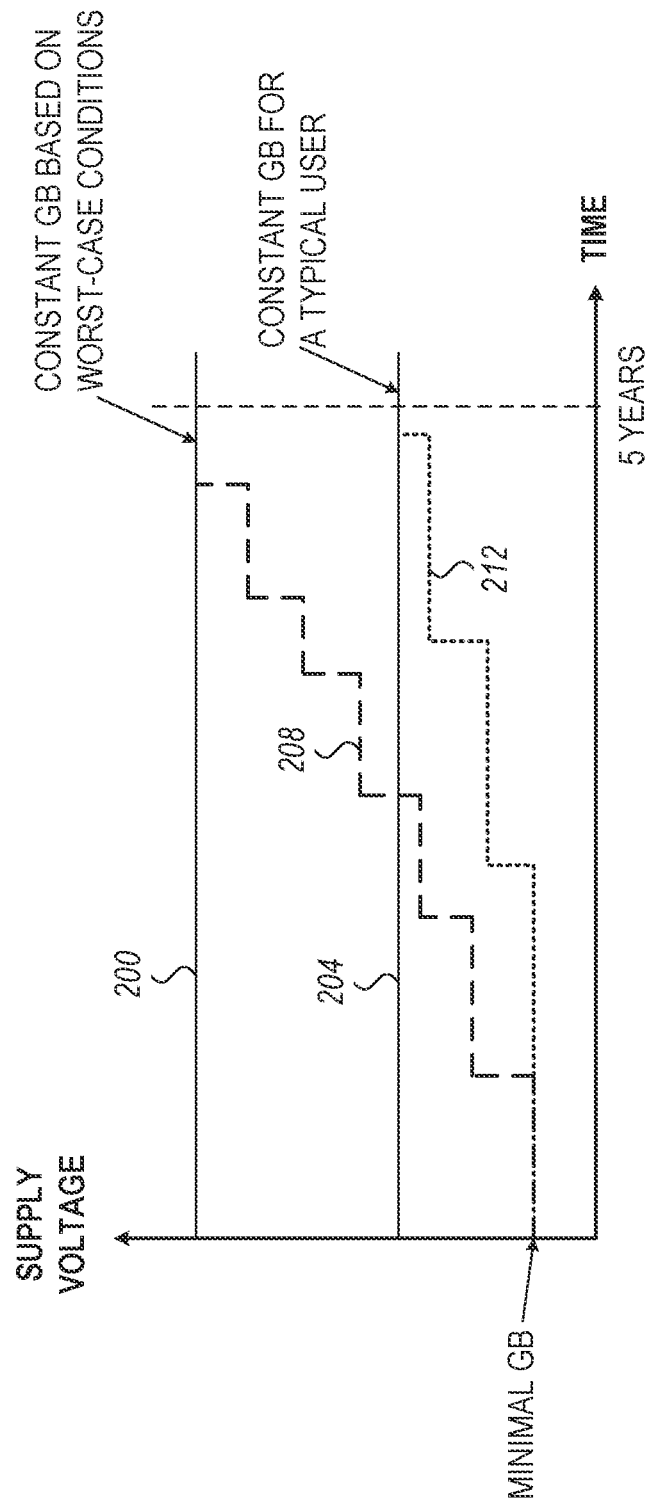
FIG. 4 is a diagram that schematically illustrates gradual increase of supply voltage provided to select transistors during lifetime for mitigating readout errors caused due to aging of the select transistors, in accordance with an embodiment that is described herein.

Gradual Increase of the Supply Voltage Provided to Select Transistors During Lifetime FIG. 4 is a diagram that schematically illustrates gradual increase of supply voltage provided to select transistors during lifetime for mitigating readout errors caused due to aging of the select transistors, in accordance with an embodiment that is described herein.

In the diagram, the horizontal axis is a time axis and the vertical axis denotes the value of the supply voltage (to the select transistors) produced by power supply 72 under the control of processor 48 of memory controller 24.

Horizontal lines 200 and 204 depict constant supply voltages provided to the gates of the select transistors as determined under worst-case conditions, and for a typical user, respectively. As seen, the guard band required for worst-case conditions is much higher than that of a typical user. Consequently, setting a guard bad based on worst-case assumptions unnecessarily increases power consumption and accelerates aging of the select transistors.

Dotted lines 208 and 212 depict gradual increase of the supply voltage provided to the gates of the select transistors over time up to lines 200 and 204, respectively. The adaptive gradual increase of the voltage supplied to the select transistors is managed by processor 48 of the memory controller as described in the embodiments above. In the present example, lines 208 and 212 depict increase of the supply voltage to the select transistors in multiple voltage steps during lifetime (e.g., 5 years). As shown in the diagram, processor 48 produces a voltage step, for example, upon identifying physical degradation in the select transistors due to aging, as described above. In the present example, the voltage steps have a common size. This, however, is not mandatory, and in alternative embodiments, voltage steps having different sizes can also be used.

The embodiments described above refer mainly to identifying physical degradation of select transistors in memory cells. The disclosed embodiments are applicable, however, also to identifying physical degradation, due to aging, in transistors comprised in the storage nodes of memory cells 36 (instead of, or in addition to, e.g., a capacitor or a resistive element). An example of such memory cells are SRAM memory cells, e.g., a 6T SRAM cell having two select transistors, and four transistors constructing the storage node (arranged as two logical inverters in a back-to-back configuration). A threshold voltage increase (in absolute value) of one or more of the SRAM six transistors, due to aging, can cause the memory cell to fail, hence an SRAM array requires a voltage guard band as explained above. Other example memory cells whose storage node comprise transistors include, for example, 2T DRAM memory cells, spin-orbit-torque MRAM cells that employ two transistors in the memory cell, and other memory technologies.

In general, the embodiments disclosed in the present application are applicable to identifying physical degradation, due to aging, of any transistor in the unit memory cell or the memory array, whether it be a select transistor or part of the storage node, and in response modifying the supply voltage provided to the select transistor and/or to the transistors in the storage nodes of the memory cells.

In one configuration, the memory controller is coupled to a memory comprising a plurality of memory cells, wherein the memory being powered by an adjustable supply voltage. The memory controller identifies that the memory experiences physical degradation due to aging, based on the times of occurrence and address locations logged in the error events, and adjusts the supply voltage provided to the memory, to compensate for the physical degradation Select Transistors Based on Materials Other than Silicon Some storage devices such as L3/L4 cache memories are implemented using SRAM devices, which do not scale well with modern cache memory requirements. In seeking for a replacement to SRAM technology, other types of select transistors for memory cells, which are based on materials other than single crystal silicon, are being developed. The Indium gallium zinc oxide (IGZO) transistor is an example of such a non-silicon new transistor.

Select transistors of such new technologies are prone to reliability degradation caused by physical degradation of the select transistors with age. The reliability guard-band for these new transistors may be considerably higher than the guard band suitable for single crystal silicon devices, e.g., due to material defects and nonuniformities. The disclosed embodiments implementing an adaptive scheme for gradual increase in the supply voltage provided to the select transistors are therefore advantageous for memories based on the new types of select transistors, compared to including a large guard band, as explained above.

Since the new memory technologies may require unique operating conditions, in some embodiments, the memory devices are powered by separate power rails (e.g., rails 76 in FIG. 1), possibly supplying different supply voltages to the select transistors in different memory devices, thus maximizing flexibility and optimizes usage of power supply resources.

Additional future memory technologies incorporating unique select transistors, e.g., Ferroelectric transistor memories and 3D DRAM, may also benefit from the disclosed adaptive guard band scheme, to minimize reliability guard bands, optimize power consumption and dynamically compensate for physical degradation of the select transistors due to aging.

The embodiments described above are given by way of example, and other suitable embodiments can also be used.

Although the embodiments described herein mainly address non-Flash memory cells, the methods and systems described herein can also be used in other applications, such as in storage systems based on Flash memories.

It will be appreciated that the embodiments described above are cited by way of example, and that the following claims are not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A controller comprising:
an interface for communicating with a plurality of memory cells arranged in multiple address locations, the memory cells comprising (i) respective storage nodes for holding storage values, and (ii) respective select transistors for selecting and accessing the respective storage nodes, the select transistors being powered by an adjustable supply voltage; and
control circuitry, configured to:
read data units protected by an Error Correction Code (ECC) from the memory cells, and decode the ECC of the data units;
upon detecting, using the ECC, that a given data unit read from a given address location contains one or more errors, log an error event specifying at least a time of occurrence associated with the error event and the given address location;
identify that the select transistors, which are used for selecting and accessing the storage nodes of the memory cells, experience physical degradation due to aging, based on the times of occurrence and address locations logged in the error events; and
adjust the supply voltage provided to the select transistors to compensate for the physical degradation of the select transistors.

2. The controller according to claim 1, wherein the control circuitry is configured to identify that the select transistors experience physical degradation by determining that at least some of the error events meet a localization criterion among the address locations.

3. The controller according to claim 2, wherein the control circuitry is configured to identify localized error events sharing a common address location, and to determine that the error events meet the localization criterion in response to detecting that a rate of the localized error events exceeds a localized error rate threshold.

4. The controller according to claim 1, wherein the control circuitry is configured to include in the error event a correctability indication of whether the errors in the data unit are correctable or not using the ECC, and to identify that the select transistors experience physical degradation when a rate of the error events corresponding to uncorrectable data units exceeds a specified uncorrectable rate.

5. The controller according to claim 1, wherein the control circuitry is configured to refrain from adjusting the supply voltage for compensating for the physical degradation of the select transistors, in response to detecting that an operational parameter of a memory device comprising the memory cells does not meet a specified condition.

6. The controller according to claim 1, wherein the control circuitry is configured to apply one or more memory management countermeasures for reducing a rate of the error events, and to adjust the supply voltage provided to the select transistors in response to identifying that the rate of the error events has not reduced by applying the countermeasures.

7. The controller according to claim 1, wherein the circuitry is configured to read the data units from the memory cells using non-destructive read operations, and to re-read an uncorrectable data unit after adjusting the supply voltage provided to the select transistors.

8. The controller according to claim 1, wherein the control circuitry is configured to increase the supply voltage provided to the select transistors gradually during a lifetime of the memory cells.

9. The controller according to claim 1, wherein the select transistors are constructed from indium gallium zinc oxide (IGZO).

10. The controller according to claim 1, wherein the control circuitry is configured to measure one or more environmental parameters selected from a list comprising: a geographical altitude and a geographical location, and to determine whether the select transistors experience the physical degradation based on one or more of the environmental parameters.

11. The controller according to claim 1, wherein the select transistors comprise Metal-Oxide-Semiconductor (MOS) devices.

12. A method for data storage, comprising:
in a controller that communicates with a plurality of memory cells arranged in multiple address locations, the memory cells comprising (i) respective storage nodes for holding storage values, and (ii) respective select transistors for selecting and accessing the respective storage nodes, the select transistors being powered by an adjustable supply voltage,
reading data units protected by an Error Correction Code (ECC) from the memory cells, and decoding the ECC of the data units;
upon detecting, using the ECC, that a given data unit read from a given address location contains one or more errors, logging an error event specifying at least a time of occurrence associated with the error event and the given address location;
identifying that the select transistors, which are used for selecting and accessing the storage nodes of the memory cells, experience physical degradation due to aging, based on the times of occurrence and address locations logged in the error events; and
adjusting the supply voltage provided to the select transistors to compensate for the physical degradation of the select transistors.

13. The method according to claim 12, wherein identifying that the select transistors experience physical degradation comprises determining that at least some of the error events meet a localization criterion among the address locations.

14. The method according to claim 13, and comprising identifying localized error events sharing a common address location, and wherein determining that the error events meet the localization criterion comprises determining that the error events meet the localization criterion in response to detecting that a rate of the localized error events exceeds a localized error rate threshold.

15. The method according to claim 12, and comprising including in the error event a correctability indication of whether the errors in the data unit are correctable or not using the ECC, and identifying that the select transistors experience physical degradation when a rate of the error events corresponding to uncorrectable data units exceeds a specified uncorrectable rate.

16. The method according to claim 12, and comprising refraining from adjusting the supply voltage for compensating for the physical degradation of the select transistors, in response to detecting that an operational parameter of a memory device comprising the memory cells does not meet a specified condition.

17. The method according to claim 12, and comprising applying one or more memory management countermeasures for reducing a rate of the error events, and adjusting the supply voltage provided to the select transistors in response to identifying that the rate of the error events has not reduced by applying the countermeasures.

18. The method according to claim 12, wherein adjusting the supply voltage comprises increasing the supply voltage provided to the select transistors gradually during a lifetime of the memory cells.

19. The method according to claim 12, wherein the select transistors are constructed from indium gallium zinc oxide (IGZO).

20. The method according to claim 12, and comprising measuring one or more environmental parameters selected from a list comprising: a geographical altitude and a geographical location, and determining whether the select transistors experience the physical degradation based on one or more of the environmental parameters.

21. The method according to claim 12, wherein the select transistors comprise Metal-Oxide-Semiconductor (MOS) devices.

* * * * *